United States Patent
Jung

(10) Patent No.: US 11,127,921 B2
(45) Date of Patent: Sep. 21, 2021

(54) ORGANIC LIGHT-EMITTING DISPLAY APPARATUS HAVING PERIPHERAL AREA INCLUDING METAL-CONTAINING LAYER AND PLURALITY OF DAMS

(71) Applicant: SAMSUNG DISPLAY CO., LTD., Yongin-si (KR)

(72) Inventor: Kwangchul Jung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/456,346

(22) Filed: Jun. 28, 2019

(65) Prior Publication Data

US 2020/0006697 A1 Jan. 2, 2020

(30) Foreign Application Priority Data

Jun. 29, 2018 (KR) ........................ 10-2018-0076109

(51) Int. Cl.
*H01L 51/52* (2006.01)
*H01L 27/32* (2006.01)

(52) U.S. Cl.
CPC ...... *H01L 51/5246* (2013.01); *H01L 27/3246* (2013.01); *H01L 27/3258* (2013.01); *H01L 27/3262* (2013.01); *H01L 27/3276* (2013.01); *H01L 51/5243* (2013.01); *H01L 51/5253* (2013.01); *H01L 51/5275* (2013.01)

(58) Field of Classification Search
CPC ............. H01L 51/5246; H01L 51/5243; H01L 51/5253; H01L 27/3246; H01L 27/3258
See application file for complete search history.

(56) References Cited

U.S. PATENT DOCUMENTS

| 8,569,749 | B2 | 10/2013 | Kim |
| 9,425,434 | B2 | 8/2016 | Lee et al. |
| 9,525,015 | B2 | 12/2016 | Lee et al. |
| 9,786,729 | B2 | 10/2017 | You |
| 9,905,630 | B2 | 2/2018 | Lee et al. |

(Continued)

FOREIGN PATENT DOCUMENTS

| KR | 10-2012-0049021 A | 5/2012 |
| KR | 10-2014-0074037 A | 6/2014 |

(Continued)

*Primary Examiner* — Matthew E. Gordon
(74) *Attorney, Agent, or Firm* — Kile Park Reed & Houtteman PLLC

(57) ABSTRACT

An organic light-emitting display apparatus including a substrate having a display area and a peripheral area; a TFT in the display area; an organic insulating layer on the TFT; an OLED that includes a pixel electrode electrically connected to the TFT, an emission layer on the pixel electrode, and a counter electrode facing the pixel electrode with the emission layer therebetween; a pixel-defining layer on the organic insulating layer and having an opening overlying the pixel electrode; a first dam in the peripheral area; a second dam in the peripheral area to surround an outer periphery of the first dam; a metal-containing layer covering the first dam and including a same material as the pixel electrode; and a thin-film encapsulator on the substrate to cover the OLED and including a first and second inorganic films, and an organic film between the first and second inorganic films.

16 Claims, 8 Drawing Sheets

(56) References Cited

U.S. PATENT DOCUMENTS

2018/0205037 A1    7/2018  Kim et al.
2019/0245015 A1*   8/2019  Lee .................... H01L 51/5246

FOREIGN PATENT DOCUMENTS

| KR | 10-2016-0000980 A | 1/2016 |
| KR | 10-2017-0015629 A | 2/2017 |
| KR | 10-2016-0100135 A | 10/2017 |
| KR | 10-2018-0001717 A | 1/2018 |

* cited by examiner

ORGANIC LIGHT-EMITTING DISPLAY APPARATUS HAVING PERIPHERAL AREA INCLUDING METAL-CONTAINING LAYER AND PLURALITY OF DAMS

CROSS-REFERENCE TO RELATED APPLICATION

Korean Patent Application No. 10-2018-0076109, filed on Jun. 29, 2018, in the Korean Intellectual Property Office, and entitled: "Organic Light-Emitting Display Apparatus," is incorporated by reference herein in its entirety.

BACKGROUND

1. Field

Embodiments relate to an organic light-emitting display apparatus.

2. Description of the Related Art

Among display apparatuses, organic light-emitting display apparatuses have attracted attention as next-generation display apparatuses because of their advantages of wide viewing angles, excellent contrast ratios, and fast response times.

In general, an organic light-emitting display apparatus may include a thin-film transistor (TFT) and organic light-emitting diodes (OLEDs) formed on a substrate, and the OLEDs are self-emissive. Such organic light-emitting display apparatuses are used not only as displays for small products such as mobile phones but also as displays for large products such as televisions.

SUMMARY

The embodiments may be realized by providing an organic light-emitting display apparatus including a substrate that includes a display area and a peripheral area around the display area; a thin-film transistor (TFT) in the display area of the substrate; an organic insulating layer on the TFT and covering the TFT; an organic light-emitting diode (OLED) that includes a pixel electrode electrically connected to the TFT, an emission layer located on the pixel electrode, and a counter electrode facing the pixel electrode with the emission layer therebetween; a pixel-defining layer on the organic insulating layer, the pixel-defining layer having an opening overlying a central portion of the pixel electrode; a first dam in the peripheral area of the substrate; a second dam in the peripheral area of the substrate to surround an outer periphery of the first dam; a metal-containing layer covering the first dam, the metal-containing layer including a same material as a material of the pixel electrode; and a thin-film encapsulator over the entire substrate to cover the OLED, the thin-film encapsulator including a first inorganic film, a second inorganic film, and an organic film between the first inorganic film and the second inorganic film.

The metal-containing layer may directly contact a top surface, an inner surface, and an outer surface of the first dam.

A first end portion of the metal-containing layer may cover a terminal end of the organic insulating layer.

A second end portion of the metal-containing layer may extend to the second dam.

The first inorganic film and the second inorganic film of the thin-film encapsulator may extend to an edge of the substrate and cover the second dam.

The organic light-emitting display apparatus may further include a light enhancement layer between the counter electrode and the first inorganic film, the light enhancement layer including an inorganic material.

The light enhancement layer may extend onto the first dam and may cover the first dam.

The light enhancement layer may be directly between the metal-containing layer and the first inorganic film.

The organic light-emitting display apparatus may further include a power supply line between the organic insulating layer and the first dam, wherein an end of the power supply line is covered by the organic insulating layer.

The metal-containing layer may be between the organic insulating layer and the first dam and may electrically contact the power supply line.

The organic light-emitting display apparatus may further include a first compensation layer under the first dam, the first compensation layer including a metal.

The TFT may include a semiconductor layer, a gate electrode at least partially overlapping the semiconductor layer, and a source electrode and a drain electrode electrically connected to the semiconductor layer, and the first compensation layer may include a same material as a material of the source electrode and the drain electrode.

The organic light-emitting display apparatus may further include a second compensation layer under the first compensation layer, the second compensation layer including a same material as a material of the gate electrode.

The organic light-emitting display apparatus may further include a third compensation layer under the first compensation layer, the third compensation layer including an organic material.

The first dam may include a same material as a material of the organic insulating layer.

The second dam may include a first layer including a same material as a material of the organic insulating layer, and a second layer including a same material as a material of the pixel-defining layer.

The embodiments may be realized by providing an organic light-emitting display apparatus including a substrate that includes a display area and a peripheral area around the display area; a display in the display area of the substrate, the display including a thin-film transistor (TFT), an organic insulating layer on the TFT and covering the TFT, and an organic light-emitting diode (OLED), the OLED including a pixel electrode electrically connected to the TFT, an emission layer on the pixel electrode, and a counter electrode facing the counter electrode with the emission layer therebetween; a first dam in the peripheral area of the substrate to surround an outer periphery of the display; a metal-containing layer covering a top surface and a side surface of the first dam; and a thin-film encapsulator over the entire substrate to cover the display, the thin-film encapsulator including a first inorganic film, a second inorganic film, and an organic film between the first inorganic film and the second inorganic film; and an inorganic material layer on the first dam and directly between the metal-containing layer and the first inorganic film.

The organic light-emitting display apparatus may further include a light enhancement layer between the counter electrode and the first inorganic film to correspond to the display area, wherein the inorganic material layer includes a same material as a material of the light enhancement layer.

The light enhancement layer and the inorganic material layer may be integrally formed with each other, the light enhancement layer may have a first thickness, and the inorganic material layer may have a second thickness that is less than the first thickness.

The metal-containing layer may include a same material as a material of the pixel electrode.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
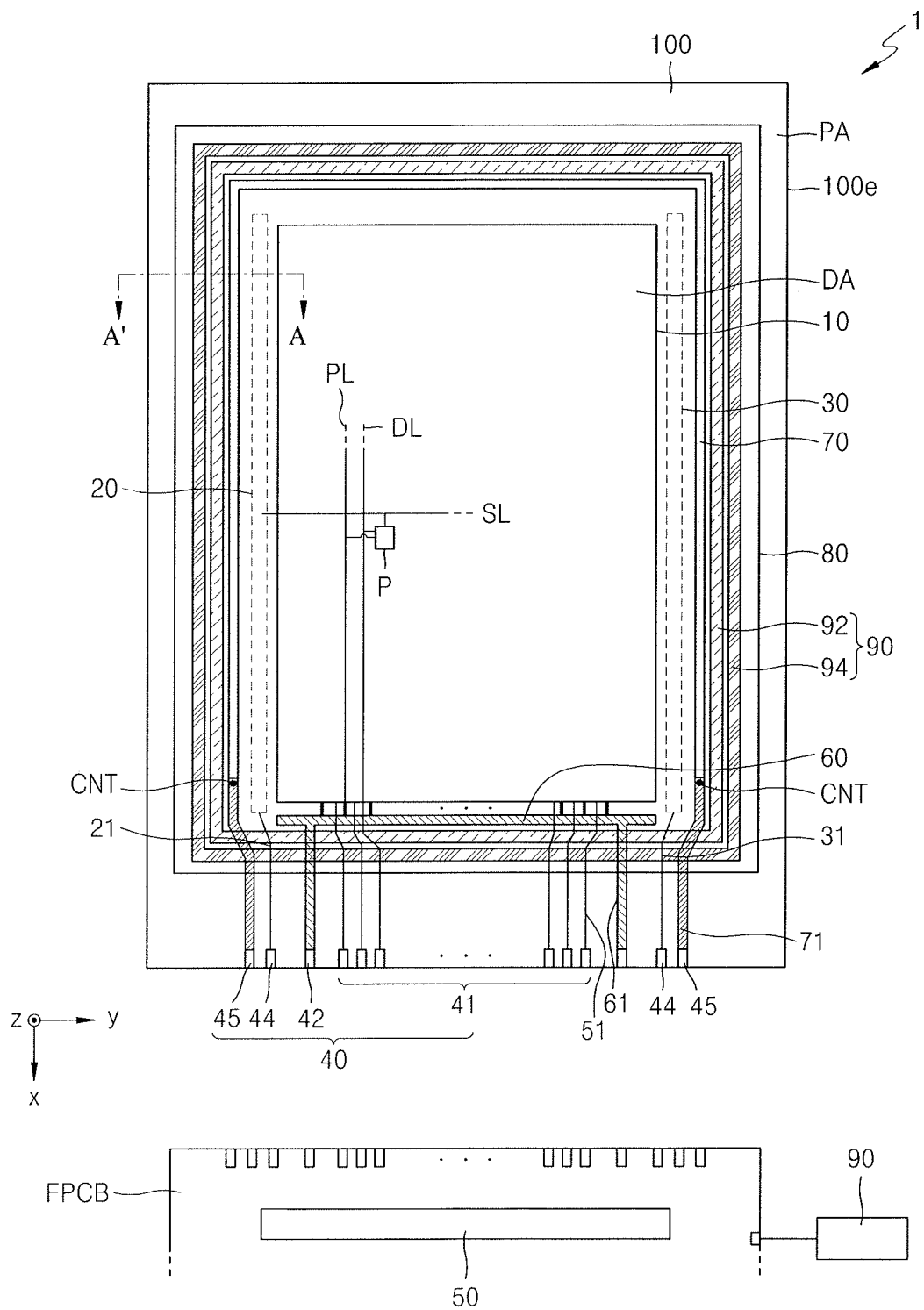
FIG. 1 illustrates a plan view of an organic light-emitting display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. For example, a layer that is directly between a first layer and a second layer directly contacts the first layer on one side thereof and directly contacts the second layer on another side thereof. Like reference numerals refer to like elements throughout.

It will be understood that although the terms "first", "second", etc. may be used herein to describe various elements, these elements should not be limited by these terms. These elements are only used to distinguish one element from another. As used herein, the singular forms "a", "an", and "the" are intended to include the plural forms as well, unless the context clearly indicates otherwise.

It will be further understood that the terms "includes," "including," "comprises" and/or "comprising" used herein specify the presence of stated features or components, but do not preclude the presence or addition of one or more other features or components. It will be understood that when a layer, region, or element is referred to as being "formed on", another layer, region, or element, it can be directly or indirectly formed on the other layer, region, or element. For example, intervening layers, regions, or elements may be present.

Sizes of elements may be exaggerated for convenience of explanation. In other words, since sizes and thicknesses of elements in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be different from the described order. For example, two consecutively described processes may be performed substantially at the same time or performed in an order opposite to the described order.

As used herein, the terms "or" and "and/or" includes any and all combinations of one or more of the associated listed items. Expressions such as "at least one of" when preceding a list of elements, modify the entire list of elements and do not modify the individual elements of the list.

Figure 2:
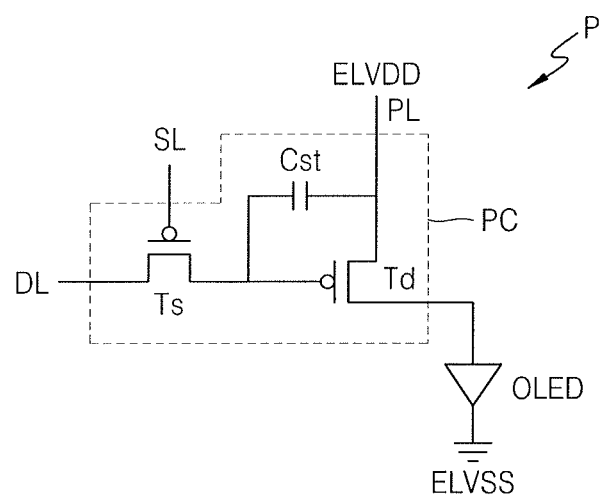
FIG. 2 illustrates an equivalent circuit diagram of one pixel of the organic light-emitting display apparatus of FIG. 1.

FIG. 1 illustrates a plan view of an organic light-emitting display apparatus 1 according to an embodiment. FIG. 2 illustrates an equivalent circuit diagram of one pixel of the organic light-emitting display apparatus 1 of FIG. 1.

Referring to FIG. 1, the organic light-emitting display apparatus 1 may include a display unit or display 10 located on a substrate 100. The display 10 may include pixels P connected to scan lines SL that extend in a y-direction and data lines DL that extend in an x-direction intersecting the y-direction. The display 10 may provide a predetermined image by using light emitted from the pixels P, and defines a display area DA.

Each of the pixels P may emit, e.g., red, green, blue, or white light. Each pixel P may include a display device, and the display device may include an organic light-emitting diode (OLED). The term 'pixel P' used herein refers to a pixel that emits light of any one color among red, green, blue, and white.

Referring to FIG. 2, the pixel P may include a pixel circuit PC connected to the scan line SL and the data line DL and the OLED connected to the pixel circuit PC. The pixel circuit PC may include a driving TFT Td, a switching TFT Ts, and a storage capacitor Cst. The switching TFT Ts may be connected to the scan line SL and the data line DL, and may transmit a data signal input through the data line DL to the driving TFT Td according to a scan signal input through the scan line SL.

The storage capacitor Cst may be connected to the switching TFT Ts and a driving voltage line PL, and may store a voltages corresponding to a difference between a voltage applied from the switching TFT Ts and a driving voltage ELVDD supplied to the driving voltage line PL.

The driving TFT Td may be connected to the driving voltage line PL and a storage capacitor Cst, and may control driving current flowing through the OLED from the driving voltage line PL in response to the voltage stored in the storage capacitor Cst. The OLED may emit light having a predetermined luminance due to the driving current. The OLED may emit, e.g., red, green, blue, or white light.

In an implementation, the pixel P may include two TFTs and one storage capacitor, as illustrated in FIG. 2. In an implementation, the pixel circuit PC of the pixel P may include three or more TFTs, or two or more storage capacitors.

Referring back to FIG. 1, a peripheral area PA may be located outside the display area DA. For example, the peripheral area PA may surround the display area DA. The peripheral area PA where the pixels P are not located may be a non-display area where an image is not provided.

In the peripheral area PA, a driving circuit (e.g., first and second scan driving circuits 20 and 30), a pad unit or pad array 40, a driving power supply wiring 60, and a common power supply wiring 70 may be located.

The first and second scan driving circuits 20 and 30 may be located in the peripheral area PA of the substrate 100, and may generate and transmit a scan signal to each pixel P through the scan line SL. In an implementation, the first scan driving circuit 20 may be located at the left side of the display 10 and the second scan driving circuit 30 may be located at the right side of the display 10. In an implementation, only one scan driving circuit may be provided.

The pad array 40 may be located on an end portion of the substrate 100, and may include a plurality of pads 41, 42, 44, and 45. The pad array 40 may be exposed without being covered by an insulating layer, and may be electrically connected to a flexible printed circuit board (FPCB). The pad array 40 may be located on a side of the substrate 100 where the first and second scan driving circuits 20 and 30 are not located.

The FPCB may electrically connect a controller 55 and the pad array 40, and a signal or power transmitted from the controller 55 is applied through connection wirings 21, 31, 51, 61, and 71 connected to the pad array 40.

The controller 55 may receive a vertical synchronization signal, a horizontal synchronization signal, and a clock signal to generate a control signal for controlling driving of the first and second scan driving circuits 20 and 30, and may transmit the generated control signal to the first and second scan driving circuits 20 and 30 through the connection wirings 21 and 31 and the pad 44 connected to the FPCB, and a scan signal of the first and second scan driving circuits 20 and 30 may be applied to each pixel P through the scan line SL. The controller 55 supplies driving power ELVDD and common power ELVSS to the driving power supply wiring 60 and the common power supply wiring 70 through the connection wirings 61 and 71 and the pads 42 and 45 connected to the FPCB. The driving power ELVDD may be supplied to each pixel P through the driving voltage line PL, and the common power ELVSS may be supplied to a common electrode of the pixel P.

A data driving circuit 50 may be located on the FPCB. The data driving circuit 50 applies a data signal to each pixel P. The data signal of the data driving circuit 50 is applied to each pixel P through the connection wiring 51 connected to the pad 41 and the data line DL connected to the connection wiring 51. In an implementation, the data driving circuit 50 may be located on the FPCB, as illustrated in FIG. 1. In an implementation, the data driving circuit 50 may be located in the peripheral area PA of the substrate 100.

The driving power supply wiring 60 may be located in the peripheral area PA. For example, the driving power supply wiring 60 may be located between the pad array 40 and a side of the display 10 adjacent to the pad array 40. The driving power ELVDD supplied through the connection wiring 61 connected to the pad 41 may be supplied to each pixel P through the driving voltage line PL.

The common power supply wiring 70 may be located in the peripheral area PA, and may partially surround the display 10. For example, the common power supply wiring 70 having a loop shape where the side of the display 10 adjacent to the pad array 40 is opened may extend along an edge 100e of the substrate 100 other than the pad array 40.

The common power supply wiring 70 of FIG. 1 may be electrically connected to the connection wiring 71 connected to the pad 45, and supplies the common power ELVSS to a counter electrode 230 (e.g., a cathode) of the OLED of the pixel P. In FIG. 1, the common power supply wiring 70 has a loop shape where a side of the common power supply wiring 70 partially surrounding the display 10 is opened, and partially overlaps the connection wiring 71. The connection wiring 71 and the common power supply wiring 70 may be connected to each other through a contact hole CNT of an insulating layer, e.g., an inorganic insulating layer, located between the connection wiring 71 and the common power supply wiring 70, and the contact hole CNT where the connection wiring 71 and the common power supply wiring 70 contact each other may be adjacent to the side of the display 10 facing the pad array 40. In an implementation, the common power supply wiring 70 may be directly connected to the pad 45, without the connection wiring 71.

A thin-film encapsulation unit or thin-film encapsulator 80 for sealing the display 10 from the outside may be further provided on the display 10. The thin-film encapsulator 80 may have a multi-layer structure where an inorganic film and an organic film 320 are alternately stacked. The thin-film encapsulator 80 may extend to the edge 100e of the substrate 100 to cover the display 10 and circuits (e.g., the first and second scan driving circuits 20 and 30 and the common power supply wiring 70) located in the peripheral area PA.

A dam portion or dam 90 may be located outside the common power supply wiring 70. In an implementation, the dam 90 may include a first dam 92 and a second dam 94. The first dam 92 may be closer to the common power supply wiring 70 than the second dam 94, and the second dam 94 may surround an outer periphery of the first dam 92. The thin-film encapsulator 80 may be provided to cover both the first dam 92 and the second dam 94.

Figure 3:
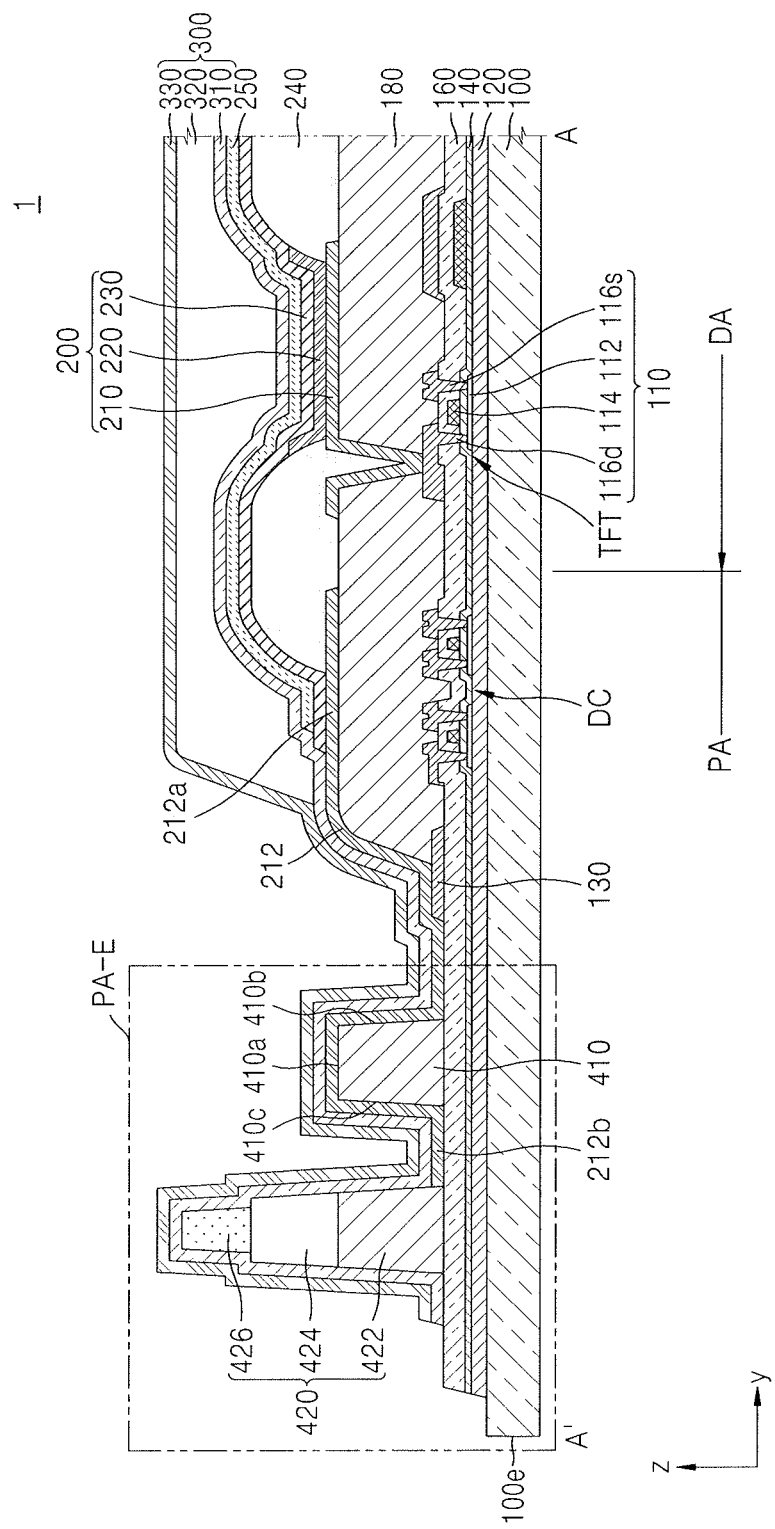
FIG. 3 illustrates a cross-sectional view taken along a line A-A' of FIG. 1.
Figure 4:
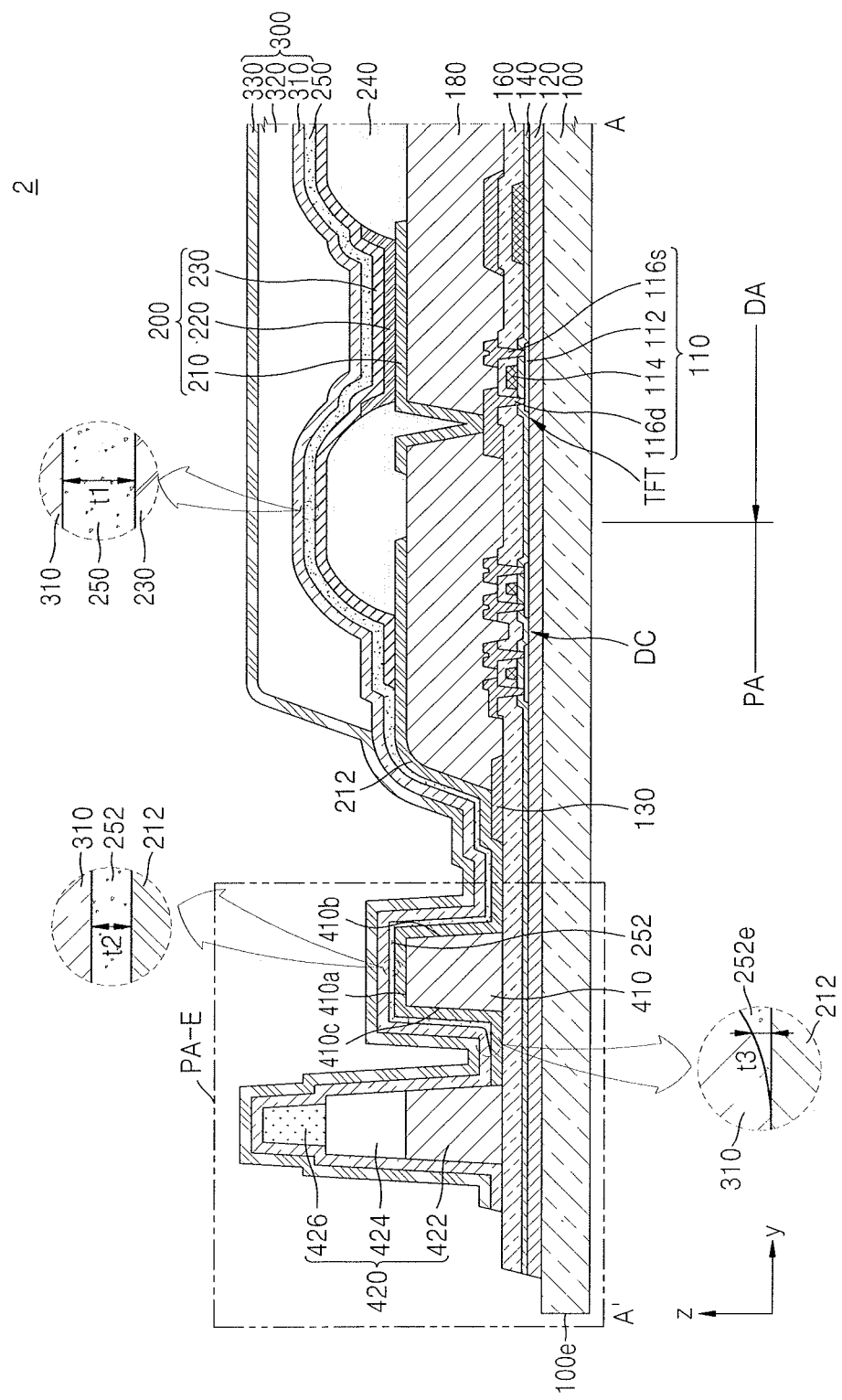
FIG. 4 illustrates a cross-sectional view of an organic light-emitting display apparatus according to another embodiment.

FIG. 3 illustrates a cross-sectional view taken along line A-A' of FIG. 1. FIG. 4 illustrates a cross-sectional view of an organic light-emitting display apparatus according to another embodiment.

FIG. 4 illustrates a cross-sectional view taken along line A-A', like in FIG. 3, and there is a difference between FIG. 4 and FIG. 3 in a structure of an light enhancement layer 250. Except the difference, FIG. 4 is the same as FIG. 3, and thus the following will focus on the difference.

Referring to FIG. 3, the organic light-emitting display apparatus 1 may include the display area DA and the peripheral area PA. The substrate 100 may be formed of a suitable material, e.g., a glass material, a metal material, or a plastic material (e.g., polyethylene terephthalate (PET), polyethylene naphthalate (PEN), or polyimide).

Referring to the display area DA of FIG. 3, a display may be located in the display area DA. The display may roughly include various layers, wirings, and devices located in the display area DA.

A buffer layer 120 may be located on the substrate 100. The buffer layer 120 may help prevent foreign materials or moisture from penetrating through the substrate 100. For example, the buffer layer 120 may include an inorganic material such as silicon oxide (SiOx), silicon nitride (SiNx), or/and silicon oxynitride (SiON), and may have a single or multi-layer structure.

A TFT 110 may include a semiconductor layer 112 and a gate electrode 114. The semiconductor layer 112 may include, e.g., polysilicon. The semiconductor layer 112 may include a channel region overlapping the gate electrode 114, and a source region and a drain region located at both sides of the channel region and including impurities at a concentration higher than that of the channel region. The impurities may include N-type impurities or P-type impurities. The source region and the drain region may be electrically connected to a source electrode 116s and/or a drain electrode 116d of the TFT 110.

In an implementation, the semiconductor layer 112 may include polysilicon. In an implementation, the semiconductor layer 112 may include amorphous silicon, or may include an organic semiconductor material.

A gate insulating film 140 may be located between the semiconductor layer 112 and the gate electrode 114. The gate insulating film 140 may be an inorganic insulating layer formed of SiON, SiOx, and/or SiNx, and the inorganic insulating layer may have a single or multi-layer structure.

In an implementation, an interlayer insulating film 160 may be located between the gate electrode 114 and the source electrode 116s and/or the drain electrode 116d. The interlayer insulating film 160 may include, e.g., an organic insulating material or an inorganic insulating material. Examples of the organic insulating material may include an imide-based polymer such as polyimide, a general-purpose polymer such as polymethylmethacrylate (PMMA) or polystyrene (PS), a polymer derivative having a phenol-based group, an acryl-based polymer, an arylether-based polymer, an amide-based polymer, a fluorine-based polymer, a p-xylene-based polymer, a vinyl alcohol-based polymer, and a blend thereof. The inorganic insulating material may be SiON, SiOx, and/or SiNx. The interlayer insulating film 160 may have a single or multi-layer structure.

An organic insulating layer 180 may be located on the TFT 110. The organic insulating layer 180 may help protect the TFT 110, and may planarize a top surface of the TFT 110. The organic insulating layer 180 may include, e.g., an imide-based polymer, a general-purpose polymer such as PMMA or PS, a polymer derivative having a phenol-based group, an acryl-based polymer, an arylether-based polymer, an amide-based polymer, a fluorine-based polymer, a p-xylene-based polymer, a vinyl alcohol-based polymer, or a blend thereof.

An OLED 200 may be located on the organic insulating layer 180. The OLED 200 may include a pixel electrode 210, the counter electrode 230, and an intermediate layer 220 located between the pixel electrode 210 and the counter electrode 230.

A pixel-defining layer 240 may be located on the pixel electrode 210, and may define a pixel by having an opening corresponding to each sub-pixel, e.g., an opening overlying or through which at least a central portion of the pixel electrode 210 is exposed. Also, the pixel-defining layer 240 may help prevent an arc or the like from occurring between the pixel electrode 210 and the counter electrode 230 by increasing a distance between an edge of the pixel electrode 210 and the counter electrode 230. The pixel-defining layer 240 may be formed of an organic material such as polyimide or hexamethyldisiloxane (HMDSO).

In an implementation, a spacer may be further located on the pixel-defining layer 240.

The pixel electrode 210 and the intermediate layer 220 may be (semi)transparent electrodes or reflective electrodes. When the pixel electrode 210 and the intermediate layer 220 are (semi)transparent electrodes, the pixel electrode 210 and the intermediate layer 220 may be formed of, e.g., indium tin oxide (ITO), indium zinc oxide (IZO), zinc oxide (ZnO), $In_2O_3$, indium gallium oxide (IGO), or aluminum zinc oxide (AZO). When the pixel electrode 210 and the intermediate layer 220 are reflective electrodes, the pixel electrode 210 and the intermediate layer 220 may include a reflective film formed of silver (Ag), magnesium (Mg), aluminum (Al), platinum (Pt), palladium (Pd), gold (Au), nickel (Ni), neodymium (Nd), iridium (Ir), chromium (Cr), or a compound thereof, and a layer formed of ITO, IZO, ZnO, $In_2O_3$, IGO, or AZO. In an implementation, and the pixel electrode 210 and the intermediate layer 220 may be formed of suitable materials and may have a single or multi-layer structure.

When the intermediate layer 220 includes a polymer material, the intermediate layer 220 may generally include a hole transport layer HTL and an emission layer EML. In an implementation, the hole transport layer HTL may include poly(3,4-ethylenedioxythiophene) (PEDOT), and the emission layer EML may include a polymer material such as a poly-phenylenevinylene (PPV)-based material or a polyfluorene-based material. In an implementation, at least one of layers constituting the intermediate layer 220 may be integrally formed over a plurality of the pixel electrodes 210. In an implementation, the intermediate layer 220 may include a layer patterned to correspond to each of the plurality of pixel electrodes 210.

The counter electrode 230 may be located in the display area DA, and may be located over the entire display area DA. For example, the counter electrode 230 may be integrally formed or commonly formed to cover a plurality of pixels.

When the counter electrode 230 is a (semi)transparent electrode, the counter electrode 230 may include a layer formed of a metal having a low work function, e.g., lithium (Li), calcium (Ca), LiF/Ca, LiF/Al, Al, Ag, Mg, or a compound thereof, and a (semi)transparent conductive layer formed of ITO, IZO, ZnO, or $In_2O_3$. When the counter electrode 230 is a reflective electrode, the counter electrode 230 may include a layer formed of Li, Ca, LiF/Ca, LiF/Al, Al, Ag, Mg, or a compound thereof.

A thin-film encapsulator 300 may be located on the counter electrode 230. The thin-film encapsulator 300 of the present embodiment may include a first inorganic film 310, a second inorganic film 330, and the organic film 320 between the first inorganic film 310 and the second inorganic film 330. The organic film 320 may be sealed by the first inorganic film 310 and the second inorganic film 330, and may be located over the display area DA and a part of the peripheral area PA adjacent to the display area DA. In an implementation, the organic film 320 may be located on the organic insulating layer 180.

The organic film 320 of the thin-film encapsulator 300 may include, e.g., an acrylic resin, a methacrylic resin, polyisoprene, a vinyl resin, an epoxy resin, a urethane resin, a cellulose resin or a perylene resin. For example, the organic film 320 may include butyl acrylate, ethylhexyl acrylate, propylene glycol methacrylate, tetrahydrofurfuryl methacrylate, vinyl acetate, N-vinylpyrrolidone, cycloaliphatic epoxide, epoxy acrylate, vinyl epoxy resin, urethane acrylate, or cellulose nitrate.

The first inorganic film 310 and the second inorganic film 330 of the thin-film encapsulator 300 may include, e.g., silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride (SiON).

The light enhancement layer 250 may be located between the counter electrode 230 and the thin-film encapsulator 300. The light enhancement layer 250 may be, e.g., a low refractive layer. The light enhancement layer 250 may facilitate efficient emission of light generated by the OLED 200, and may help protect the OLED 200 from damage that may occur in a subsequent process using plasma or the like. The light enhancement layer 250 may include, e.g., lithium fluoride (LiF). The light enhancement layer 250 may be located in the display area DA.

In an implementation, the light enhancement layer 250 may be located on the counter electrode 230, as shown in FIG. 3. In an implementation, the light enhancement layer 250 may extend to a first dam 410, as shown in FIG. 4. In FIG. 3, the light enhancement layer 250 may be formed only on an open portion of a deposition mask. In an implementation, the light enhancement layer 250 may extend to the first dam 410 as shown in FIG. 4, and a part of the light enhancement layer 250 may be formed as a 'shadow film' in a manufacturing process.

The light enhancement layer 250 may be formed through a deposition method using a mask. In this case, a residual film of the light enhancement layer 250 may be formed on a portion other than an open portion of the mask, due to a gap between the mask and the substrate 100. A part of the light enhancement layer 250 formed on the portion other than the open portion of the mask may be defined as a 'shadow film'. The 'shadow film' may be formed when the gap between the substrate 100 and the mask is controlled by using a magnetic force between the mask located over the substrate 100 and a cool plate located under the substrate 100, and the formation of the 'shadow film' is inevitable during a process. The 'shadow film' may extend to the first dam 410 as shown in FIG. 4. A 'shadow film' may be formed on a first dam that is physically very weak, and peeling could occur between the first dam and the light enhancement layer whose adhesive strength to an organic material is low.

The organic light-emitting display apparatus according to an embodiment may include a metal-containing layer 212 between the light enhancement layer 250 (having low adhesive strength) and the first dam 410 to help increase adhesive strength at the first dam 410, thereby effectively reducing peeling between the light enhancement layer 250 and the first dam 410. For example, an adhesive strength between the first dam 410 and the metal-containing layer 212 and adhesive strength between the light enhancement layer 250 and the metal-containing layer 212 may be greater than an adhesive strength when the first dam 410 and the light enhancement layer 250 directly contact each other. The metal-containing layer 212 will be described in detail below.

Referring to the peripheral area PA of FIG. 3, a driving circuit DC, a power supply line 130, the first dam 410, and a second dam 420 may be sequentially arranged from the display area DA. The driving circuit DC corresponds to the first and second scan driving circuits 20 and 30 of FIG. 1, and the power supply line 130 corresponds to the common power supply wiring 70 of FIG. 1. The driving circuit DC and the power supply line 130 may surround a part of the display, as shown in FIG. 1. The power supply line 130 may supply common power to the display by being electrically connected to the counter electrode 230 through the metal-containing layer 212.

Referring to an outermost peripheral area PA-E of FIG. 3, the first dam 410 and the second dam 420 may be located outside the driving circuit DC. The first dam 410 and the second dam 420 may surround a periphery of the display as shown in FIG. 1. The organic film 320 of the thin-film encapsulator 300 may be prevented from overflowing through the first dam 410 and the second dam 420.

The first dam 410 may include the same material as that of the organic insulating layer 180. For example, the first dam 410 may include an imide-based polymer, a general-purpose polymer such as PMMA or PS, a polymer derivative having a phenol-based group, an acryl-based polymer, an arylether-based polymer, an amide-based polymer, a fluorine-based polymer, a p-xylene-based polymer, a vinyl alcohol-based polymer, of a blend thereof.

The metal-containing layer 212 may be located on the first dam 410. The metal-containing layer 212 may be directly located on the first dam 410 to directly contact and cover a top surface 410a, an inner surface 410b, and an outer surface 410c of the first dam 410. One end 212a of the metal-containing layer 212 may be located on the organic insulating layer 180 to cover a terminal end of the organic insulating layer 180, and the other end 212b of the metal-containing layer 212 may extend to the second dam 420.

The metal-containing layer 212 may include the same material as that of the pixel electrode 210. For example, the metal-containing layer 212 may be formed of ITO, IZO, ZnO, $In_2O_3$, IGO, or AZO. In an implementation, the metal-containing layer 212 may have a multi-layer structure including a layer formed of Ag, Mg, Al, Pt, Pd, Au, Ni, Nd, Ir, Cr, or a compound thereof and a layer formed of ITO, IZO, ZnO, $In_2O_3$, IGO, or AZO.

The second dam 420 may have a multi-layer structure higher than that of the first dam 410. In an implementation, the second dam 420 may include a first layer 422, a second layer 424, and a third layer 426. The first layer 422 may include the same material as that of the organic insulating layer 180, and the second layer 424 may include the same material as that of the pixel-defining layer 240. The third layer 426 may include the same material as that of a spacer located over the pixel-defining layer 240.

In an implementation, the second dam 420 may include the first layer 422, the second layer 424, and the third layer 426 as illustrated in FIG. 3. In an implementation, the second dam 420 may include only the first layer 422 and the second layer 424, without the third layer 426.

The first inorganic film 310 and the second inorganic film 330 of the thin-film encapsulator 300 may extend to the second dam 420. The first inorganic film 310 and the second inorganic film 330 may cover the first dam 410 and the second dam 420 and may extend to the edge 100e of the substrate 100. The first inorganic film 310 and the second inorganic film 330 may extend to the edge 100e of the substrate 100, and a sealing force may be maximized.

Referring to FIG. 4, FIG. 4 is the same as FIG. 3 except a structure of the light enhancement layer 250 as described above. In FIG. 4, a part of the light enhancement layer 250 includes a 'shadow film'. The following will be described on the assumption that the 'shadow film' is an inorganic material layer 252.

Referring to the peripheral area PA including the outermost peripheral area PA-E of FIG. 4, the inorganic material layer 252 that is formed at an outer periphery of a mask pattern for forming the light enhancement layer 250 during a manufacturing process may be understood as a portion formed when a part of a deposition material for forming the light enhancement layer 250 spreads into a space between the mask and the substrate 100. Accordingly, the inorganic material layer 252 may be integrally formed with (e.g., may continuously extend from) the light enhancement layer 250, and may be understood as an end of the light enhancement layer 250. Although the light enhancement layer 250 and the inorganic material layer 252 are not clearly distinguished, the light enhancement layer 250 may have a function of improving a light emitting function of the display, and the light enhancement layer 250 may be understood as a portion located in the display area DA and the inorganic material layer 252 may be understood as a portion located in the peripheral area PA.

The light enhancement layer 250 may have a first thickness, and the inorganic material layer 252 may have a second thickness. In an implementation, the first thickness of the light enhancement layer 250 may be greater than the second thickness of the inorganic material layer 252. As described above, the inorganic material layer 252 may be defined as a portion formed when a part of a deposition material for forming the light enhancement layer 250 spreads into a space between the mask and the substrate 100, and a thickness of the inorganic material layer 252 may be less than a thickness of the light enhancement layer 250.

In an implementation, the inorganic material layer 252 may have a thickness that gradually decreases toward a terminal end 252e. The terminal end 252e of the inorganic material layer 252 may not have a side surface (e.g., may not have an upright or vertical side surface). For example, the inorganic material layer 252 may be formed so that a thickness gradually decreases toward the terminal end 252e and when the inorganic material layer 252 reaches a specific position, the inorganic material layer 252 no longer exists (e.g., the thickness reduces to 0). The 'specific position' may be defined as a position where the first dam 410 is covered under a current manufacturing process design.

The metal-containing layer 212, the inorganic material layer 252, and the first inorganic film 310 and the second inorganic film 330 of the thin-film encapsulator 300 may be sequentially stacked on the first dam 410. The metal-containing layer 212 may be directly located on the first dam 410 to be in surface contact with a top surface, an inner surface, and an outer surface of the first dam 410. The inorganic material layer 252 may be located on the metal-containing layer 212. As such, the metal-containing layer 212 may be directly between the first dam 410 (including an organic material) and the inorganic material layer 252 (including an inorganic material), and adhesive strength between the first dam 410 and the inorganic material layer 252 may be effectively improved.

Figure 5:
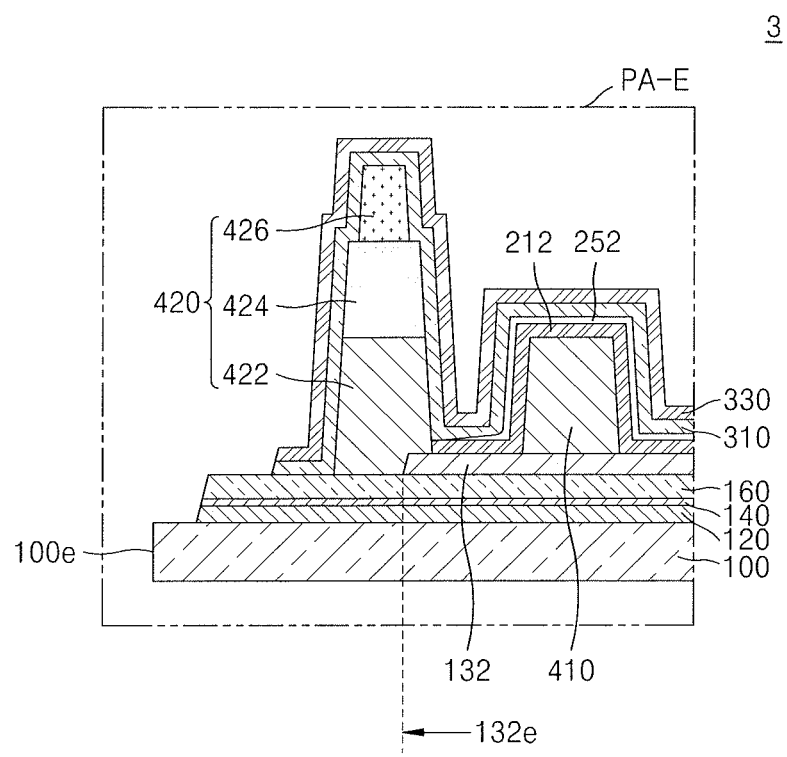
FIG. 5 illustrates a cross-sectional view of a part of an organic light-emitting display apparatus according to another embodiment.

FIG. 5 illustrates a cross-sectional view of a part of an organic light-emitting display apparatus according to another embodiment. There is a difference between FIG. 5 and FIGS. 3 and 4 in a structure of the outermost peripheral area PA-E.

Referring to FIG. 5, the buffer layer 120, the gate insulating film 140, and the interlayer insulating film 160 may extend to the outermost peripheral area PA-E. The first dam 410 and the second dam 420 (including the first layer through the third layer 422, 424, and 426) may be located over the buffer layer 120, the gate insulating film 140, and the interlayer insulating film 160, and the first inorganic film 310 and the second inorganic film 330 of the thin-film encapsulator 300 may extend to the edge 100e of the substrate 100 to cover the first dam 410 and the second dam 420.

In the present embodiment, a first compensation layer 132 may be located under the first dam 410. The first compensation layer 132 may be located on the same layer as the power supply line 130 of FIG. 4 and may include the same material as that of the power supply line 130 of FIG. 4. The first compensation layer 132 may be a part extending from the power supply line 130, or may be a separate layer. The first compensation layer 132 may be located under the first dam 410, and a height of the first dam 410 may be maintained.

The metal-containing layer 212 may be located on the first dam 410 and the metal-containing layer 212 may help improve adhesive strength between the first dam 410 and the inorganic material layer 252, and it may not easy to additionally form a layer on the metal-containing layer 212 formed of the same material as that of the pixel electrode 210. Accordingly, in order to compensate for a level difference of the first dam 410, the first compensation layer 132 may be located under the first dam 410 to maintain a height of the first dam 410.

In an implementation, as illustrated in FIG. 5, the first compensation layer 132 may extend to the second dam 420, and a terminal end 130e of the first compensation layer 132 is covered by the second dam 420. In an implementation, the first compensation layer 132 may have a suitable structure that compensates for a level difference of the first dam 410.

Figure 6:
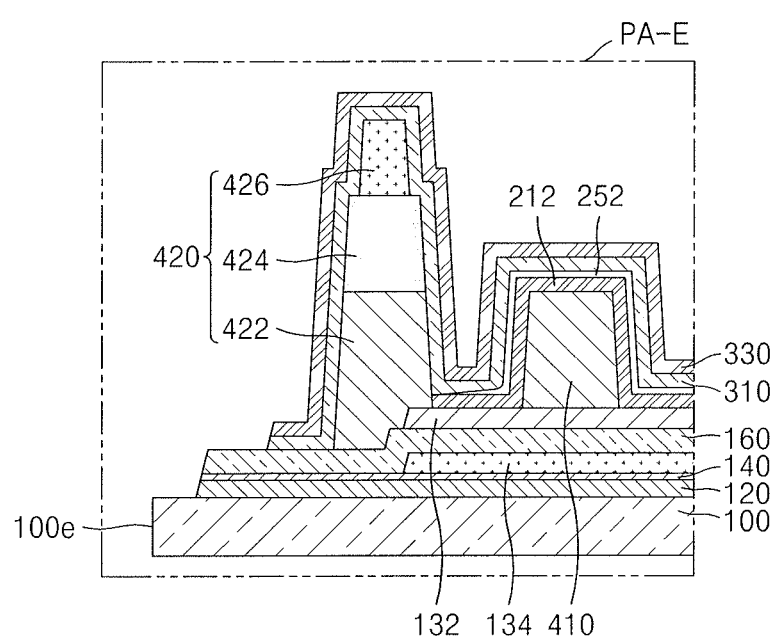
FIG. 6 illustrates a cross-sectional view of a part of an organic light-emitting display apparatus according to another embodiment.

FIG. 6 illustrates a cross-sectional view of a part of an organic light-emitting display apparatus according to another embodiment. There is a difference between FIG. 6 and FIGS. 3 and 4 in a structure of the outermost peripheral area PA-E.

Referring to FIG. 6, the buffer layer 120, the gate insulating film 140, and the interlayer insulating film 160 may extend to the outermost peripheral area PA-E. The first dam 410 and the second dam 420 (including the first through third layers 422, 424, and 426) may be located over the buffer layer 120, the gate insulating film 140, and the interlayer insulating film 160, and the first inorganic film 310 and the second inorganic film 330 of the thin-film encapsulator 300 may extend to the edge 100e of the substrate 100 to cover the first dam 410 and the second dam 420.

In the present embodiment, the first compensation layer 132 and a second compensation layer 134 may be located under the first dam 410. The first compensation layer 132 may include the same material as that of the power supply line 130 of FIG. 3 or 4. The first compensation layer 132 may be a part extending from the power supply line 130, or may be a separate layer. The second compensation layer 134 may include the same material as that of the gate electrode 114 of the TFT 110 of FIG. 3 or 4. The first compensation layer 132 and the second compensation layer 134 may be located under the first dam 410, and a height of the first dam 410 may be maintained.

Figure 7:
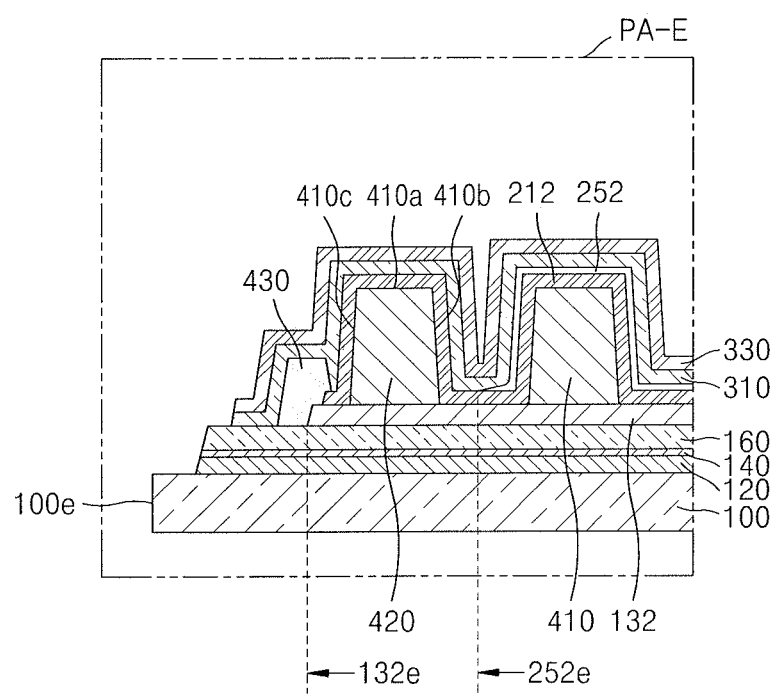
FIG. 7 illustrates a cross-sectional view of a part of an organic light-emitting display apparatus according to another embodiment.

FIG. 7 illustrates a cross-sectional view of a part of an organic light-emitting display apparatus according to another embodiment. There is a difference between FIG. 7 and FIGS. 3 and 4 in a structure of the outermost peripheral area PA-E.

Referring to FIG. 7, the buffer layer 120, the gate insulating film 140, and the interlayer insulating film 160 may extend to the outermost peripheral area PA-E. The first dam 410 and the second dam 420 may be located over the buffer layer 120, the gate insulating film 140, and the interlayer insulating film 160, and the first inorganic film 310 and the second inorganic film 330 of the thin-film encapsulator 300 may extend to the edge 100e of the substrate 100 to cover the first dam 410 and the second dam 420.

In the present embodiment, the first dam 410 and the second dam 420 may have the same height. When the first dam 410 and the second dam 420 have the same height, it may mean that the second dam 420 includes only the first layer 422 of FIG. 6.

The metal-containing layer 212 may cover the first dam 410, and may extend to the second dam 420 and may be located on the second dam 420. For example, the metal-containing layer 212 may cover a top surface 420a, an inner surface 420b, and an outer surface 420c of the second dam 420.

The first compensation layer 132 may be located under the first dam 410 and the second dam 420. The first compensation layer 132 may include the same material as that of the power supply line 130 of FIG. 3 or 4. The first compensation layer 132 may be a part extending from the power supply line 130, or may be a separate layer. The first compensation layer 132 may be located under the first dam 410 and the second dam 420, and a height of the first dam 410 and the second dam 4720 may be maintained.

The terminal end 132e of the first compensation layer 132 of FIG. 7 may extend to the outside of the second dam 420, and the terminal end 132e of the first compensation layer 132 may be covered by an insulating film 430.

In an implementation, the second compensation layer 134 may be further located under the first dam 410 and the second dam 420 of FIG. 7, like in FIG. 6.

Figure 8:
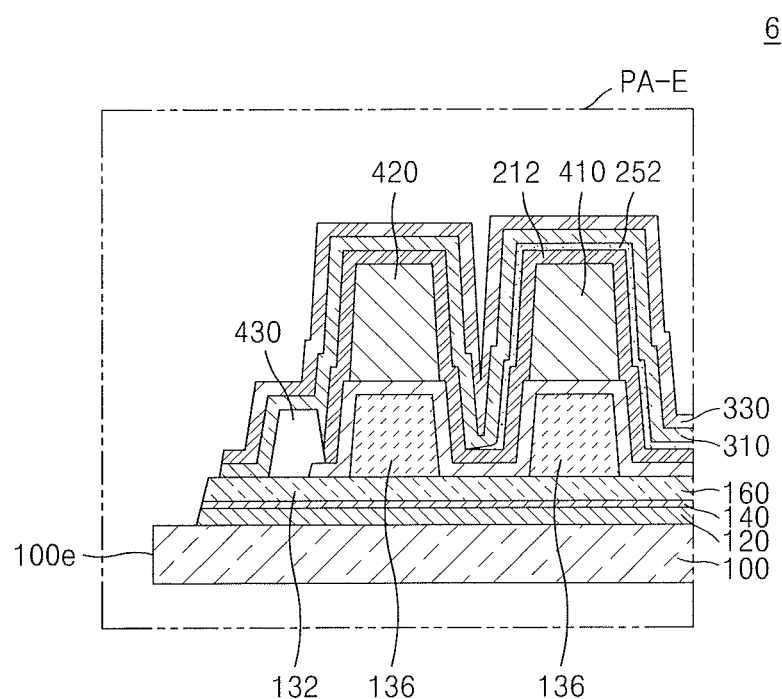
FIG. 8 illustrates a cross-sectional view of a part of an organic light-emitting display apparatus according to another embodiment.

FIG. 8 illustrates a cross-sectional view of a part of an organic light-emitting display apparatus according to another embodiment. There is a difference between FIG. 8 and FIG. 7 in that a third compensation layer 136 is further located under the first dam 410 and the second dam 420.

Referring to FIG. 8, the third compensation layer 136 may be further located under the first dam 410 and the second dam 420. The third compensation layer 136 may be located under the first compensation layer 132. The third compensation layer 136 may be an organic insulating film including an organic material.

By way of summation and review, in some organic light-emitting display apparatuses and methods of manufacturing the same, peeling could occur due to adhesive strength between layers located at a peripheral portion of a display area, thereby reducing the quality of the organic light-emitting display apparatuses.

As described above, according to the one or more embodiments, an organic light-emitting display apparatus for displaying a high-quality image by preventing peeling at a peripheral portion of a display area may be realized.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting display apparatus, comprising:
   a substrate that includes a display area and a peripheral area around the display area;
   a thin-film transistor (TFT) in the display area of the substrate;
   an organic insulating layer on the TFT and covering the TFT;
   an organic light-emitting diode (OLED) that includes a pixel electrode electrically connected to the TFT, an emission layer on the pixel electrode, and a counter electrode facing the pixel electrode with the emission layer therebetween;
   a pixel-defining layer on the organic insulating layer, the pixel-defining layer having an opening overlying a central portion of the pixel electrode;
   a first dam in the peripheral area of the substrate;
   a second dam in the peripheral area of the substrate to surround an outer periphery of the first dam;
   a metal-containing layer covering the first dam, the metal-containing layer including a same material as a material of the pixel electrode; and
   a thin-film encapsulator over the substrate to cover the OLED, the thin-film encapsulator including a first inorganic film, a second inorganic film, and an organic film between the first inorganic film and the second inorganic film.

2. The organic light-emitting display apparatus as claimed in claim 1, wherein the metal-containing layer directly contacts a top surface, an inner surface, and an outer surface of the first dam.

3. The organic light-emitting display apparatus as claimed in claim 1, wherein a first end portion of the metal-containing layer covers a terminal end of the organic insulating layer.

4. The organic light-emitting display apparatus as claimed in claim 1, wherein a second end portion of the metal-containing layer extends to the second dam.

5. The organic light-emitting display apparatus as claimed in claim 1, wherein the first inorganic film and the second inorganic film of the thin-film encapsulator extend to an edge of the substrate and cover the second dam.

6. The organic light-emitting display apparatus as claimed in claim 1, further comprising a light enhancement layer between the counter electrode and the first inorganic film, the light enhancement layer including an inorganic material.

7. The organic light-emitting display apparatus as claimed in claim 6, wherein the light enhancement layer extends onto the first dam and covers the first dam.

8. The organic light-emitting display apparatus as claimed in claim 6, wherein the light enhancement layer is directly between the metal-containing layer and the first inorganic film.

9. The organic light-emitting display apparatus as claimed in claim 1, further comprising a power supply line between the organic insulating layer and the first dam,
   wherein an end of the power supply line is covered by the organic insulating layer.

10. The organic light-emitting display apparatus as claimed in claim 9, wherein the metal-containing layer is between the organic insulating layer and the first dam and electrically contacts the power supply line.

11. The organic light-emitting display apparatus as claimed in claim 9, further comprising a first compensation layer under the first dam, the first compensation layer including a metal.

12. The organic light-emitting display apparatus as claimed in claim 11, wherein:
- the TFT includes a semiconductor layer, a gate electrode at least partially overlapping the semiconductor layer, and a source electrode and a drain electrode electrically connected to the semiconductor layer, and
- the first compensation layer includes a same material as a material of the source electrode and the drain electrode.

13. The organic light-emitting display apparatus as claimed in claim 11, further comprising a second compensation layer under the first compensation layer, the second compensation layer including a same material as a material of the gate electrode.

14. The organic light-emitting display apparatus as claimed in claim 11, further comprising a third compensation layer under the first compensation layer, the third compensation layer including an organic material.

15. The organic light-emitting display apparatus as claimed in claim 1, wherein the first dam includes a same material as a material of the organic insulating layer.

16. The organic light-emitting display apparatus as claimed in claim 1, wherein the second dam includes:
- a first layer including a same material as a material of the organic insulating layer, and
- a second layer including a same material as a material of the pixel-defining layer.

* * * * *